(12) United States Patent
Vijayan et al.

(10) Patent No.: US 6,445,213 B1
(45) Date of Patent: Sep. 3, 2002

(54) METHOD FOR CALCULATING DYNAMIC LOGIC BLOCK PROPAGATION DELAY TARGETS USING TIME BORROWING

(75) Inventors: Gopal Vijayan; James S. Blomgren; Donald W. Glowka; Stephen C. Horne, all of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/844,686

(22) Filed: Apr. 27, 2001

Related U.S. Application Data (60) Provisional application No. 60/261,574, filed on Jan. 13, 2001, and provisional application No. 60/251,169, filed on Dec. 4, 2000.

(51) Int. Cl.$^7$ ............................................... H03K 19/00
(52) U.S. Cl. ............................ 326/93; 326/95; 326/112
(58) Field of Search ............................... 326/93, 95–98, 326/112, 119, 121

(56) References Cited

U.S. PATENT DOCUMENTS

| | | | |
|---|---|---|---|
| 5,434,520 A | | 7/1995 | Yetter et al. |
| 5,517,136 A | | 5/1996 | Harris et al. |
| 5,745,724 A | * | 4/1998 | Favor et al. ................. 395/389 |
| 5,880,609 A | | 3/1999 | Klass et al. |
| 5,983,013 A | | 11/1999 | Rogers et al. |
| 6,018,254 A | | 1/2000 | Rogers et al. |
| 6,118,304 A | | 9/2000 | Potter et al. |
| 6,201,415 B1 | * | 3/2001 | Manglore ..................... 326/98 |
| 6,324,664 B1 | * | 11/2001 | Farwell et al. ............... 714/726 |

OTHER PUBLICATIONS

Harris, Skew–Tolerant Domino Circuits, IEEE Journal of Solid–State Circuits, Nov. 1997, 1702–1711, vol. 32, No. 11.

* cited by examiner

*Primary Examiner*—Don Phu Le
(74) *Attorney, Agent, or Firm*—Booth & Wright, LLP; Matthew J. Booth (57) ABSTRACT

The present invention is a dynamic logic propagation delay targeting tool that includes a gate target delay initializer 90, a levelizer 82, a backward logic scanner 94, a forward logic scanner 96, a gate target delay incrementor 97, and a gate target delay comparator 97 that together calculates the propagation delay of a signal in a specified block of dynamic logic.

14 Claims, 7 Drawing Sheets

METHOD FOR CALCULATING DYNAMIC LOGIC BLOCK PROPAGATION DELAY TARGETS USING TIME BORROWING

This application claims the benefits of the earlier filed U.S. Provisional Application Ser. No. 60/251,169, filed Dec. 4, 2000, which is incorporated by reference for all purposes into this specification.

Additionally, this application claims the benefits of the earlier filed U.S. Provisional Application Ser. No. 60/261,574, filed Jan. 13, 2001, which is incorporated by reference for all purposes into this specification.

BACKGROUND OF THE INVENTION

1. Field of the Invention

The present invention relates to the design of dynamic logic devices. More specifically, the present invention relates to calculating dynamic logic block propagation delay targets using time borrowing.

2. Description of the Related Art

Figure 5:
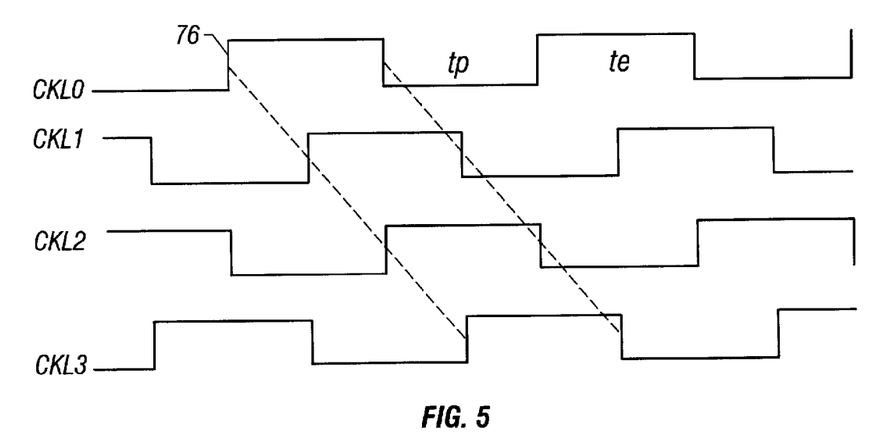
FIG. 5 illustrates an overlapping clock structure for N-NARY logic that is suitable for design by the present invention.

Certain styles of CMOS dynamic logic designs have an overlapping clocking structure that allow slower dynamic logic gates to borrow evaluation time from faster dynamic logic gates. FIG. 5 illustrates an example of an overlapping clock structure that is part of the logic synchronization structure found in N-NARY logic. The logic synchronization illustrated in FIG. 5 is describe in greater detail in U.S. Pat. No. 6,118,304 to Potter et al., which is incorporated by reference into this disclosure. Further, N-NARY logic is described in greater detail in U.S. Pat. No. 6,069,497 to Blomgren et al., which is incorporated by reference into this disclosure.

FIG. 5 illustrates 4 overlapping clocks, CLK0, CLK1, CLK2, and CLK3. The 4 clocks can be derived from a single master global clock (not shown). As is typical to various types of dynamic logic, the clock cycle of an individual clock is divided into a precharge phase, tp, and an evaluate phase, te. The precharge phase tp is the part of the clock cycle where the PFETs of a dynamic logic gate are precharging the evaluate nodes of the logic gate, and the evaluate phase te is the part of the clock cycle where the logic gate evaluates the inputs of the gate to produce an output. A feature of the logic synchronization of N-NARY logic is the evaluate wave window 76 where 2 or more clocks are in the evaluate cycle at any given point in time. The evaluate wave and its overlapping clock structure of this technique of logic synchronization allows N-NARY logic to be designed without latches, buffers, or other types of delay devices in the critical signal path.

The design tool of the present invention is suitable for use in the design of N-NARY logic with the logic synchronization illustrated in FIG. 5. Further, the present invention is suitable for use in the design of other types of dynamic logic that use overlapping clock structures such as the logic and clocking described in the following patents and articles: U.S. Pat. No. 5,434,520 to Yetter et al.; U.S. Pat. No. 5,517,136 to Harris et al.; Harris, D., and Horowitz, M., Skew-Tolerant Domino Circuits, IEEE Journal of Solid-State Circuits, Vol. 32, No. 11, pp. 1702–1711 (November 1997); U.S. Pat. No. 5,880,609 to Klass et al.; U.S. Pat. No. 5,983,013 to Rogers et al.; U.S. Pat. No. 6,018,254 to Rogers et al.; all of which are incorporated by reference into this disclosure.

Time borrowing, as illustrated in the above patents and articles, can be used to slow down complex logic gates and or speed up simple logic gates. Without time borrowing, the slowest logic gate in the design would determine the clocking speed for a specified block of logic in the design. With time borrowing, the slowest logic gate can borrow time from preceding or succeeding faster logic gates. Therefore, the clocking speed is no longer constrained by the slowest logic gate, but it is determined by the arrangement of logic gates on the logic paths between the inputs and outputs of the specified block of dynamic logic.

In a block of dynamic logic where the logic gate propagation delays are not all equal, a certain amount of time borrowing will naturally occur, and the clocking speed of the logic block may be increased until the logic block fails to operate. A faster design for the logic block can typically be obtained if time borrowing is planned, i.e. certain logic gates are deliberately designed to be slow and certain logic gates are deliberately designed to be fast. One way to optimize the clocking speed of dynamic logic is for a logic designer to carefully plan the logic gate propagation delays so that the logic block speed is optimized. Hand optimization of dynamic logic is a time consuming task however for a logic designer. Thus, a more systematic and automated method is required to analyze a dynamic logic circuit block and determine the propagation delay targets for the dynamic logic gates that comprise the block of logic.

SUMMARY OF THE INVENTION

The present invention is a dynamic logic propagation delay targeting tool that calculates the propagation delay of a signal in a specified block of dynamic logic. The present invention comprises a gate target delay initializer, a levelizer, a backward logic scanner, a forward logic scanner, a gate target delay incrementor, and a gate target delay comparator that together calculates the propagation delay of a signal.

The gate target delay initializer of the present invention calculates the initial delay targets for all logic gates in the specified block of dynamic logic.

The levelizer of the present invention levelizes all the logic gates in the specified block of logic where the levelizing of all the logic gates further comprises ordering the logic gates in the logic block to analyze the propagation of the signal through the logic block.

The present invention further comprises a backward logic scanner that backward scans the logic gates of the specified block of logic and then calculates for each individual scanned logic gate an output backward surplus of delay at the individual scanned logic gate's output and an input backward surplus of delay at the individual logic gate's input. The output backward surplus of delay at the individual scanned logic gate's output is defined to be the minimum of all the backward surpluses of delay at the inputs of all the logic gates that are connected to the output of the individual scanned logic gate. And, the input backward surplus of delay at the individual logic gate's input is equal to the nominal phase delay−(Current Delay Target of Gate+Wire Delay at output of Gate)+Backward surplus at output of Gate.

The present invention further comprises a forward logic scanner that forward scans the logic gates of the specified block of logic and then calculates for each individual scanned logic gate an input forward surplus of delay at the individual scanned logic gate's input and an output forward surplus of delay at the individual scanned logic gate's output. The input forward surplus of delay at the individual scanned logic gate's input is defined to be the minimum of all the forward surpluses of delay at the outputs of all the logic gates that are connected to the input of the individual scanned logic gate. And, the output forward surplus of delay at the individual scanned logic gate's output is equal to the nominal phase delay−(Current Delay Target of Gate+Wire Delay at output of Gate)+Forward surplus at input of Gate.

The present invention further comprises a gate target delay incrementor that increments delay targets if a positive surplus of delay exists for each individual scanned logic gate of the specified block of logic where the positive surplus of delay is defined as the (Forward surplus at output of Gate+Backward surplus at output of Gate)>=0.

The present invention further comprises a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention is a method and apparatus for calculating dynamic logic block propagation delay targets using time borrowing. This disclosure describes numerous specific details that include structures, circuits, and logic functions in order to provide a thorough understanding of the present invention. For example, the present invention describes circuits and blocks of circuits designed for N-NARY logic and the overlapping clocking structure (logic synchronization) for N-NARY logic. However, the practice of the present invention includes other types of dynamic logic and other types of overlapping clocking structures. One skilled in the art will appreciate that one may practice the present invention without these specific details. Additionally, this disclosure does not describe some well known structures such as transistors, FETs, domino circuits, and dynamic circuits in detail in order not to obscure the present invention.

Figure 1:
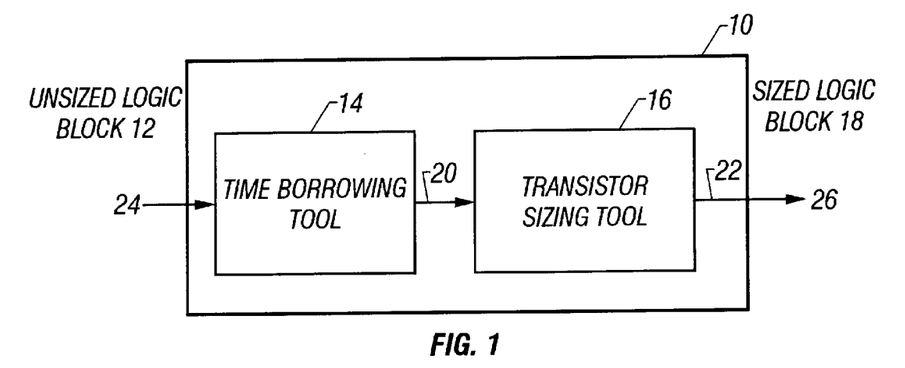
FIG. 1 illustrates a tool that sizes blocks of dynamic logic as part of an automated design process.

FIG. 1 illustrates a logic block sizing tool 10 that sizes blocks of dynamic logic as part of an automated design process for semiconductor devices. The present invention 14 is part of the automated design process for semiconductor devices. The logic block sizing tool 10 receives input from other physical layout tools. Initially, the integrated circuit (IC) design has one or more blocks of dynamic logic 12 that further comprises one or more dynamic logic gates. Each logic gate within a block of logic further comprises a number of PFETs and NFETs transistors. At the beginning of this part of the design process, the blocks of logic have been physically placed within the design, but the blocks of dynamic logic 12 have not yet been sized, i.e., the transistors do not yet have any physical dimensions (or in words, the size of the transistors is not fixed in the design). Part of the job of the logic block sizing tool 10 is to calculate the physical dimensions for the transistors of each gate in the blocks of dynamic logic.

The present invention is a dynamic logic propagation delay tool 14 that uses time borrowing and takes the schematic of the integrated circuit with the unsized blocks of dynamic logic 24 and calculates the propagation delay targets of the signals for all the logic gates in the specified logic block. A transistor sizing tool 16 takes as input a schematic for a dynamic logic gate and a target for its propagation delay (the results 20 of the present invention 14), and finds the optimum sizes for the transistors (the physical layout or geometries of the transistors) in the logic gates of the specified blocks of logic so as to meet the given propagation delay target. Typically, the transistor sizing tool 16 uses an optimization strategy to find the minimum device sizes that achieves the given propagation delay. The output 22 of the transistor sizing tool 16 are blocks of dynamic logic that with sized transistors. This output 22 is then sent to other physical layout tools or timing analysis tools as part of the automated design process for integrated circuits.

Figure 2:
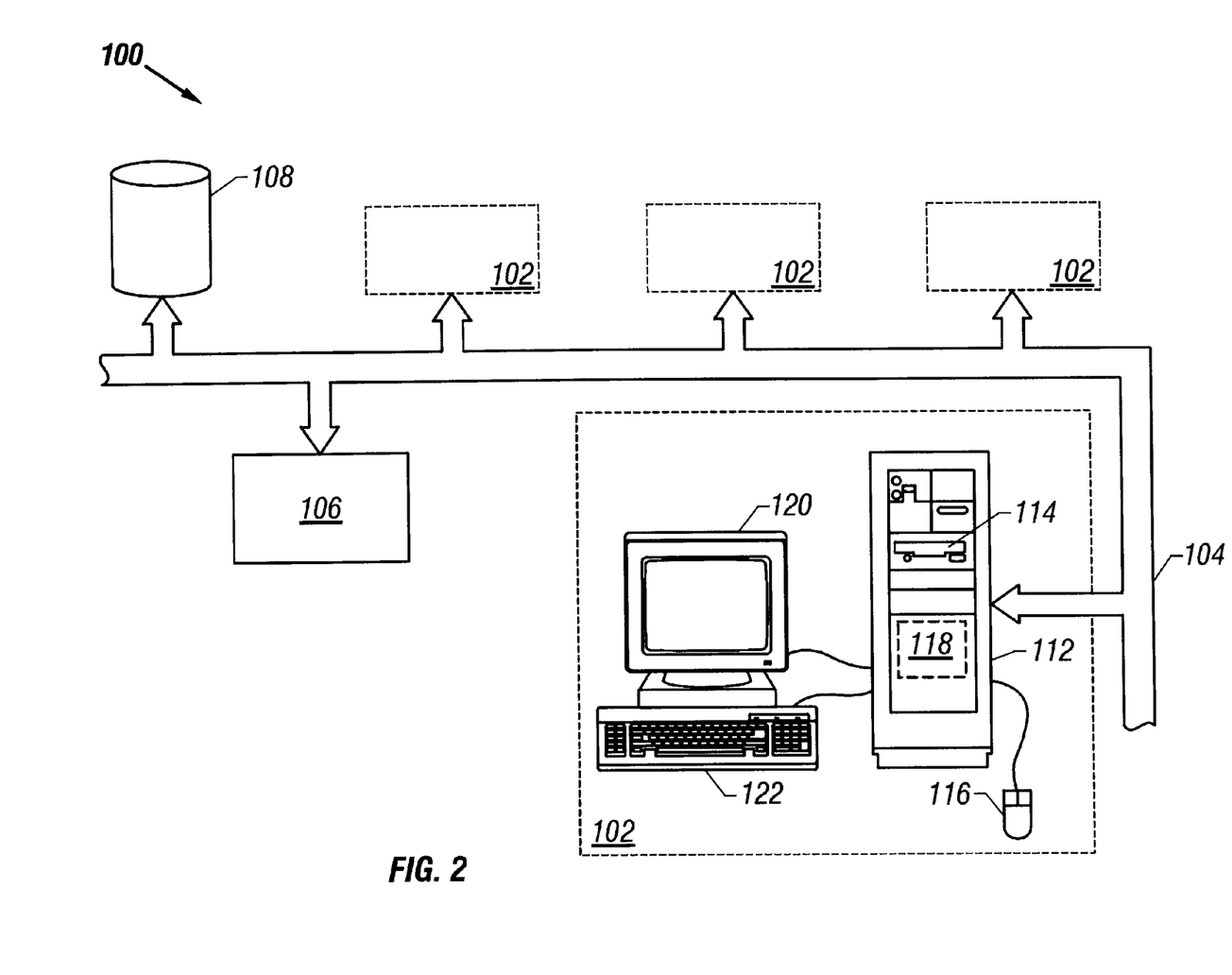
FIG. 2 shows a typical networked computer environment suitable for use with the present invention.

The present invention 14 of FIG. 1 is preferably practiced in the context of a standalone or networked computer setup such as that illustrated in FIG. 2. In FIG. 2, a typical network 100 includes one or more computer workstations 102 networked together via a network connection 104, which is controlled by a network controller 106. The network 100 may also include various peripheral devices, such as a network storage device 108 and one or more printers (not shown in FIG. 2). A typical computer workstation 102 includes a computer 112, internal storage media such as RAM and or hard disks 118, external storage media such as a floppy disk and or a CD-ROM 114, and various interface devices such as a mouse 116, a monitor 120, and a keyboard 122.

Figure 3:
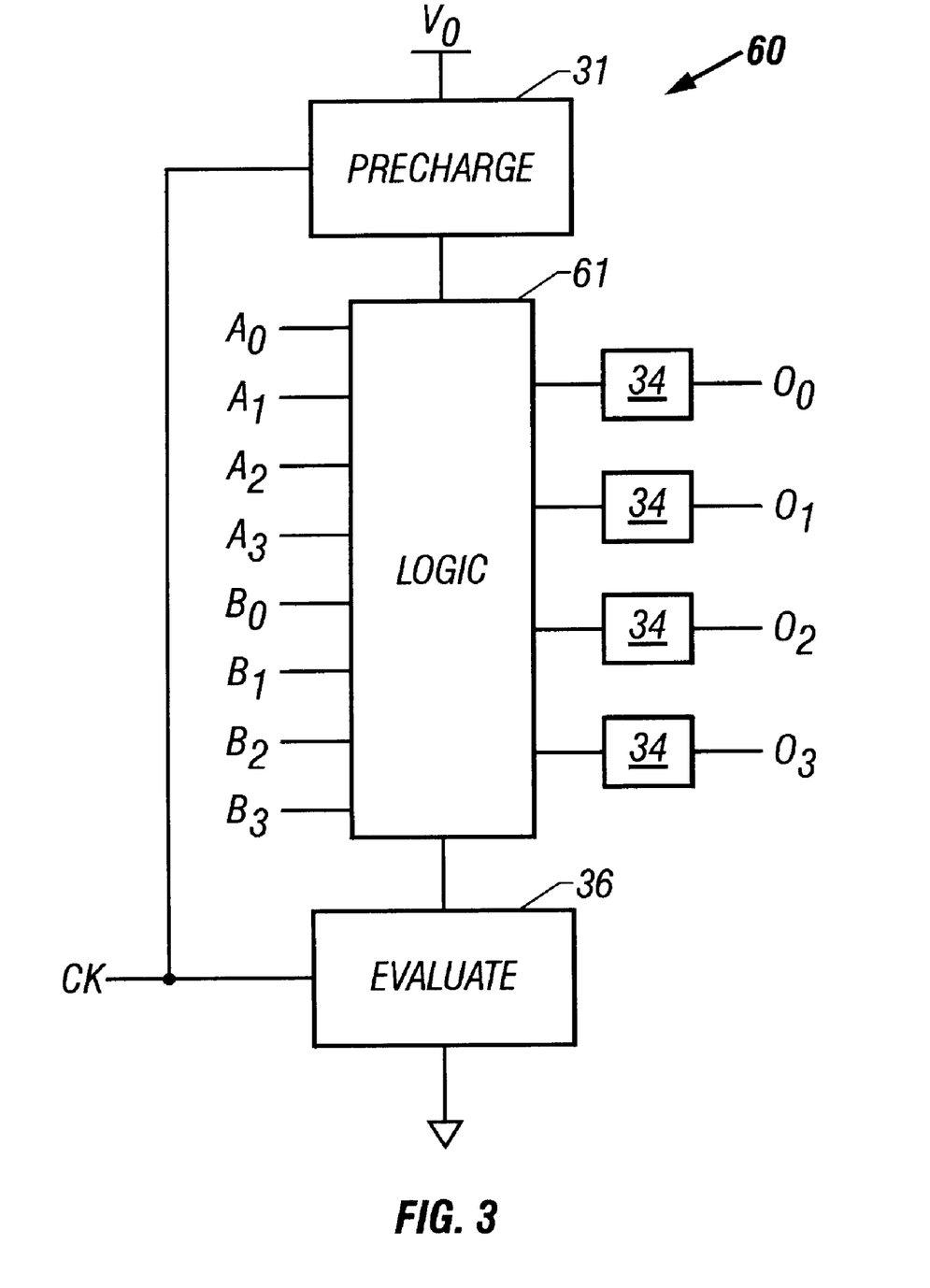
FIG. 3 is a block diagram of an N-NARY logic gate.

As previously discussed, the present invention is suitable for use in the design of various types of dynamic logic including N-NARY logic. FIG. 3 is a block diagram on an N-NARY logic gate 60 that comprises a logic tree circuit 61, a precharge circuit 31, and an evaluate circuit 36. Coupled to the logic tree circuit is a first input 1 of N signal (with N=4) A that comprises a plurality of components A0, A1, A2, and A3. Additionally coupled to the logic tree circuit is a second input 1 of N signal (with N =4) B that comprises a plurality of components B0, B1, B2, and B3. And, coupled to the logic tree circuit is an output 1 of N signal (with N=4) O that comprises a plurality of components O0, O1, O2, and O3. The logic tree circuit 61 performs a logic function on the input signals that could comprise a variety of functions, for example, the Boolean logic functions AND/NAND, OR/NOR, or XOR/Equivalence. Coupled to the wires of the plurality of output signals are the output buffers 34 that aid in driving additional circuits that couple to the output signals. A precharge circuit 31 couples to the logic tree circuit 61 and precharges the dynamic logic of the logic tree circuit. An evaluate circuit 36 couples to the logic tree circuit and controls the evaluation of the logic tree circuit. Coupled to the evaluate circuit 36 and the precharge circuit 31 is the clock signal CK.

Figure 4:
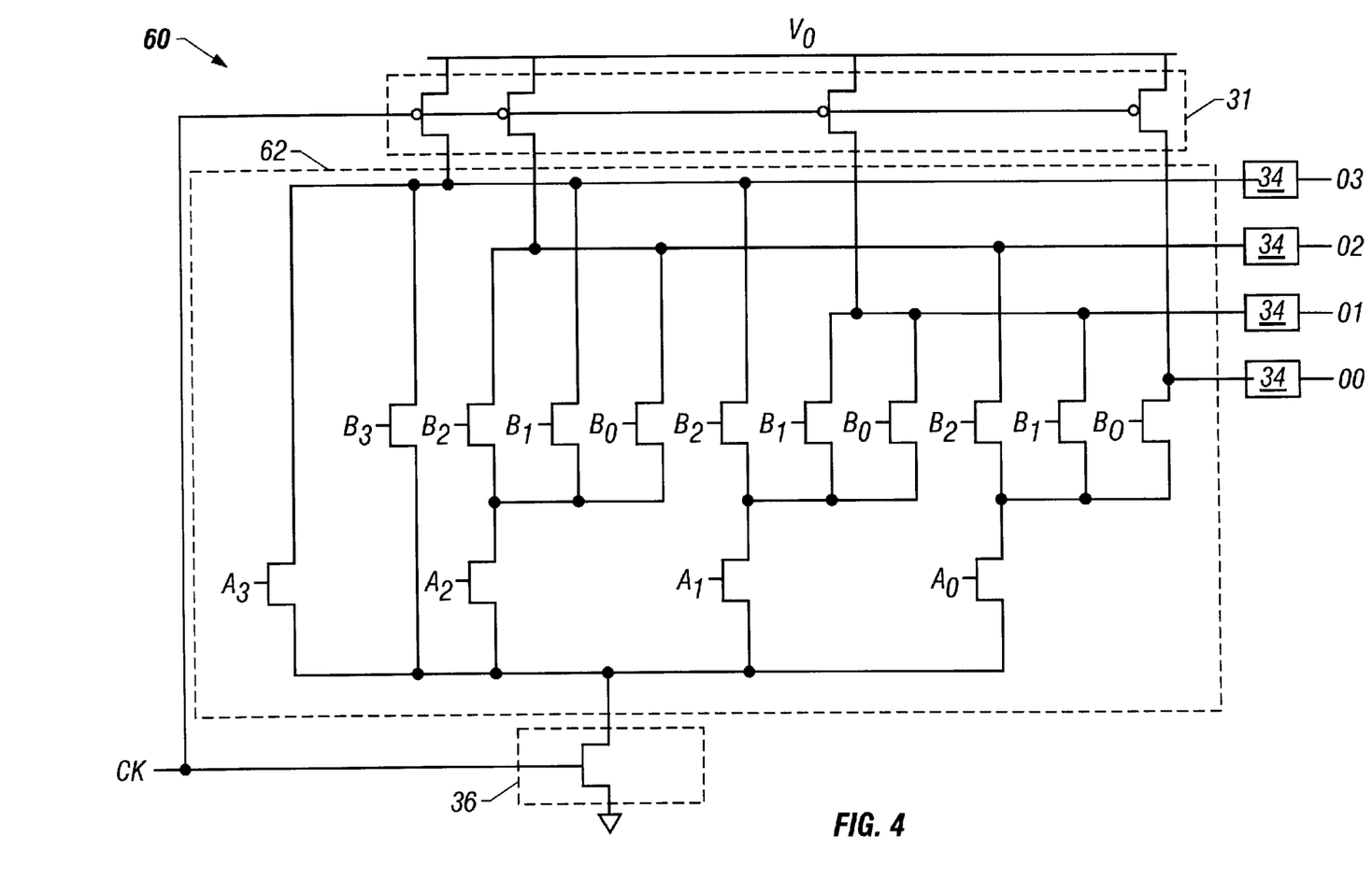
FIG. 4 is a schematic diagram on an N-NARY logic gate.

FIG. 4 is a circuit diagram of an N-NARY logic gate or circuit for the OR/NOR function. As discussed above for the block diagram, an N-NARY logic gate 60 comprises a logic tree circuit 61, a precharge circuit 31, and an evaluate circuit 36.

Figure 6:
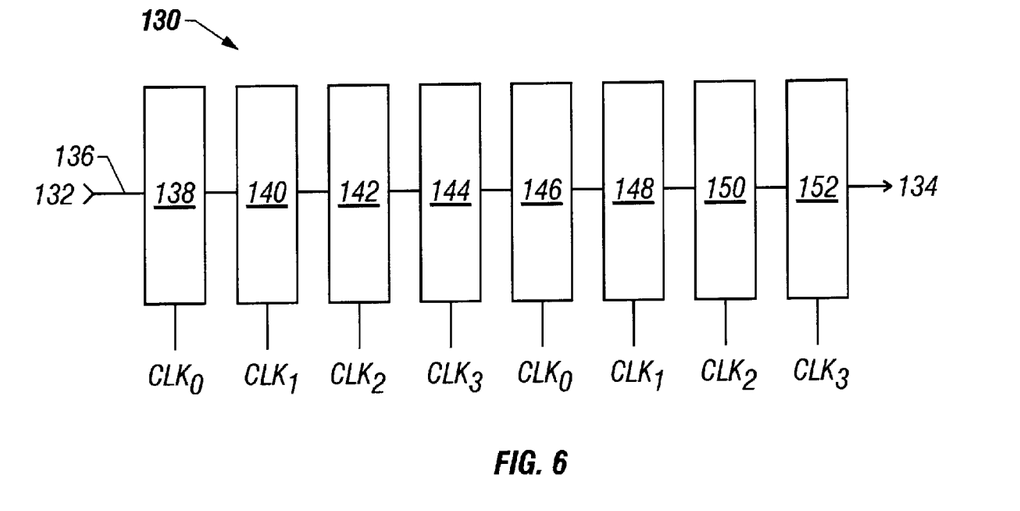
FIG. 6 illustrates a simple pipeline of logic circuits that uses the overlapping clock structure of FIG. 5 and is suitable for design by the present invention.

FIG. 6 illustrates a pipeline of logic gates or circuits (or blocks of dynamic logic) 130 in an integrated circuit using the overlapping clocking system of FIG. 5 with the clocks CLK0, CLK1, CLK2, and CLK3. The pipeline 130 is an example of a block of dynamic logic circuits that are suitable for design using the propagation delay target tool of the present invention. The pipeline 130 comprises a datapath 136, an input signal 132, and an output signal 134. The input signal 132, the datapath 136, and the output signal 134 comprises one or more wires to propagate the signals through the pipeline. For example, the input signal 132, the datapath 136, and the output signal 134 each may comprise one or more N-NARY signals. The pipeline 130 comprises blocks of dynamic logic gates 138, 140, 142, 144, 146, 148, 150, and 152 coupled in series to the datapath 136. Each block of dynamic logic gates may comprise one or more additional logic circuits. Additionally, each logic circuit may further comprise N-NARY logic circuits.

Figure 7:
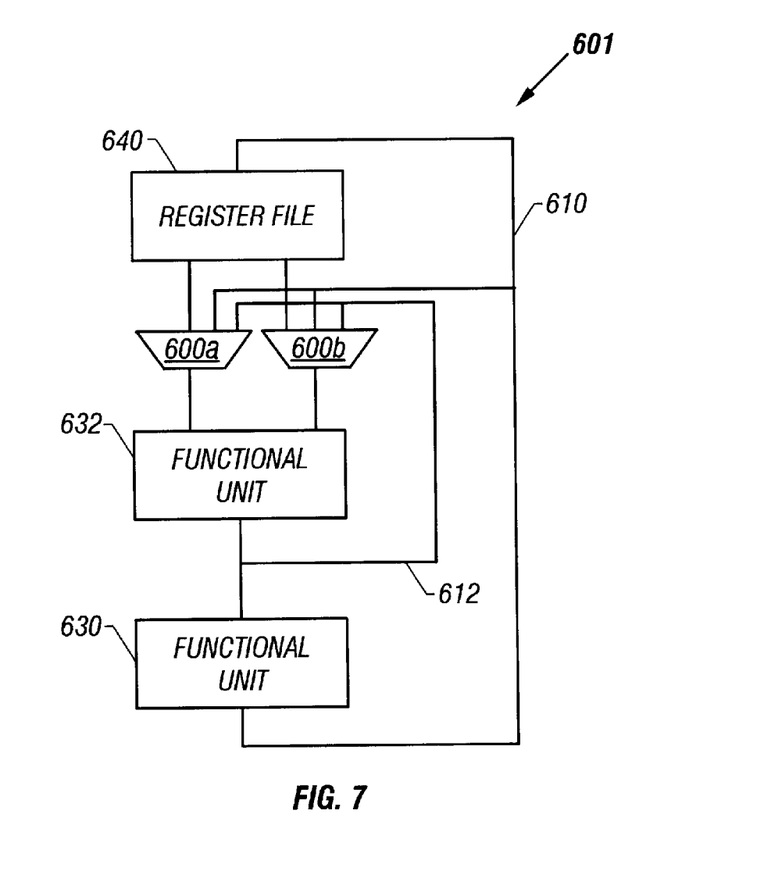
FIG. 7 illustrates another pipeline of logic circuits suitable for design by the present invention that features multiple paths that includes bypass paths.

FIG. 7 illustrates a pipeline of logic gates (or blocks of dynamic logic) 601 that is also suitable for design using the propagation delay target tool of the present invention. This pipeline 601 features multiple paths including bypass paths. Pipeline 601 comprises a register file 640 that includes 1 write port and 2 read ports, which feeds the bypass muxes 600a and 600b. The bypass muxes feed operand inputs to a single functional unit 632. The result from functional unit 632 is either incomplete, in which case it is available for bypassing on result bus 612, or it is complete or requires additional processing in functional unit 630, which then makes the result available on result bus 610. Register file 640, functional unit 632, and functional unit 630 may comprise one or more additional logic gates or circuits (e.g., a 3 stage adder). Additionally, each logic circuit may further comprise N-NARY logic circuits.

Figure 8:
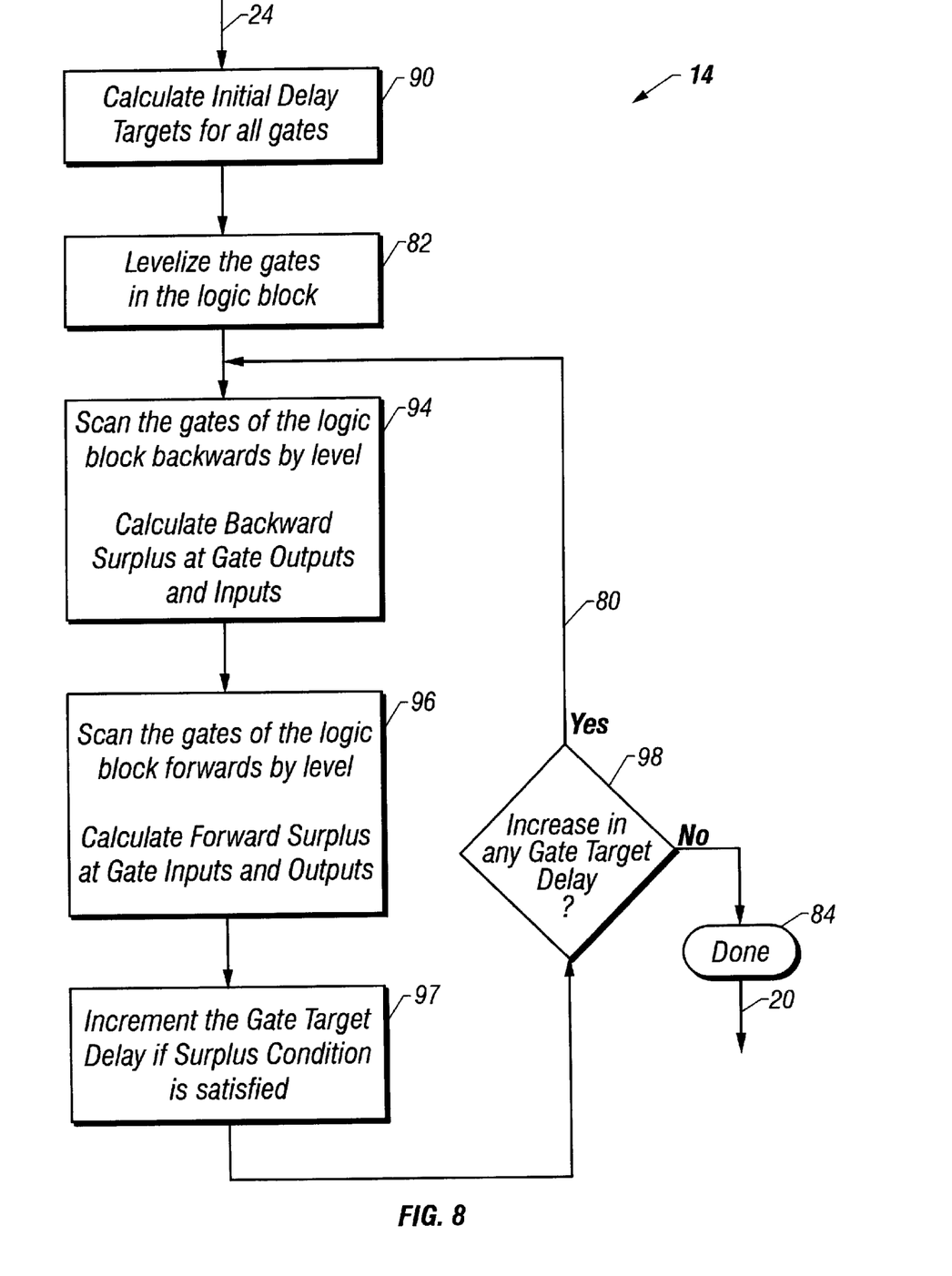
FIG. 8 illustrates an embodiment of the present invention.

FIG. 8 illustrates an embodiment of the present invention for calculating dynamic logic block propagation delay targets using time borrowing. The present invention calculates propagation delay targets for a block of dynamic logic when given a fixed operating frequency goal for the block of logic. The overall idea is to set propagation delay targets for each gate of a dynamic logic block based on the gate's complexities. The idea is for simple gates to yield a part of their evaluate time to the more complex gates. The effect of this strategy is to optimize the area and power consumed by the logic block, since the increase in area and power due to speeding up simple gates will be much smaller than the decrease in area and power from slowing down the complex gates. The practical effect of this strategy is that overall area and power for the block of dynamic logic will be reduced. An advantage of the slowing down of complex gates is that it makes the fixed frequency goal more achievable (for the complex gates) since there may be complex gates in the design that cannot meet the nominal propagation delay target.

FIG. 8 illustrates a propagation delay target (or time borrowing) tool 14 that calculates the dynamic logic block propagation delay targets using time borrowing. The tool 14 comprises a gate target delay initializer 90 that receives as input a schematic of unsized blocks of logic 24. The gate target delay initializer 90 calculates a set of initial delay targets for all of the logic gates within a specified block of logic. The initial delay targets are the minimum speed targets for the logic gates. Each logic gate's initial delay target is determined by a function of the capacitive load that the logic gate drives (its signal output), its logic complexity, and the maximum stack height of the N-stack (or Ntree, the number of NFETs between Vcc and ground) of the logic gate. One purpose of the gate target delay initializer is to set the initial delay targets based on the expected difficulty of the logic gate achieving the nominal delay target. Generally, complex logic gates will have a larger initial delay target than simple logic gates.

After the initial delay targets for the blocks of logic has been calculated, a levelizer 82 then levelizes the gates of the blocks of logic. Levelizing is the ordering of the logic gates in the logic block so that the propagation of the signal through the logic block can be analyzed. In other words, levelizing is the order of the logic gates that the signal propagates through. Levelizing is especially necessary when there are multiple signal paths in block of logic for a signal to traverse. Ordering of the gates is a condition precedent to the backward scan analysis (discussed below), then forward scan analysis (discussed below) of the signal propagation through the logic. Using FIG. 7 as an example, we let pipeline 601 represent a block of logic 601 which further comprises multiple logic gates 640, 600a, 600b, 632, and 630. As is illustrated in FIG. 7, there are multiple paths for a signal to propagate from logic gate 640 to logic gate 632, one path is through logic gate 600a and the other is through logic gate 600b. Thus, the arrangement of logic gates after levelizing for the propagation of a signal could be either 640, 600a, 600b, 632, 630 or 640, 600b, 600a, 632, 630.

The time borrowing tool 14 then uses a backward logic scanner 94 to process, level by level, the logic gates of a specified block of logic from the outputs of the block of logic to the inputs of the block of logic. When each logic gate is processed, the backward logic scanner 94 calculates the backward surplus of delay at the gate's output and input. The backward surplus of the delay at the output of a gate is calculated from the backward surplus of delay at the inputs of the logic gates connected to the individual gate's output. The backward surplus of delay at the input of a logic gate is calculated from the backward surplus of delay at the gate's output. The starting point for the calculations of these surpluses of delay are at the primary outputs of the block of logic, where the backward surplus of delay is assumed to be zero.

More formally, the backward surplus of delay at the output of a gate under consideration is defined to be the minimum of all the backward surpluses of delay at the inputs of all the logic gates that are connected to the output of the logic gate under consideration. The backward surplus of delay at the input of a logic gate=nominal phase delay−(Current Delay Target of Gate+Wire Delay at output of Gate)+Backward surplus at output of Gate. The nominal phase delay in a dynamic logic circuit is the clock period divided by the number of clock phases, i.e. the delay nominally allocated for each gate (or gate delay). If the gate is faster than this delay, then the surplus at the gate's input becomes larger than the surplus at the gate's output, i.e. the backward logic scanner adds to the total surplus that is being propagated backwards. If the gate under consideration is slower than the nominal phase delay, the backward logic scanner takes delay away from the delay surplus.

The backward surplus of delay can be positive or negative. If the surplus is positive, then this implies that there is positive slack in the downstream cone of logic, and the gate under consideration can potentially borrow from the positive slack. If the surplus is negative, then the logic gate and its upstream cone of logic has to yield a positive forward surplus of delay to compensate for the negative backward surplus of delay.

After calculating the backward surplus of delay for all of the logic gates in the specified blocks of logic, the time borrowing tool 14 next calculates the forward surplus of delay for the same logic gates in the specified blocks of logic. A forward logic scanner 96 processes, level by level, the logic gates of the specified block of logic from the inputs of the logic block to the outputs of the logic block. When each logic gate is processed, the forward logic scanner 96 calculates the forward surplus of delay at the logic gate's input and output. The forward surplus of delay at the input of a logic gate is calculated from the forward surplus of delay at the outputs of the gates connected to the gate's input. The forward surplus of delay at the output of a gate is calculated from the forward surplus of delay at the gate's input. The starting point for the calculations of these surpluses are at the primary inputs of the block of logic, where the forward surplus of delay is assumed to be zero.

More formally, the forward surplus of delay at the input of a gate under consideration is defined to be the minimum of all the forward surpluses of delay at the outputs of all gates that are connected to the input of the gate under consideration. The forward surplus of delay at the output of Gate=nominal phase delay−(Current Delay Target of Gate+Wire Delay at output of Gate)+Forward surplus at input of Gate. If the gate under consideration is faster than the nominal phase delay, the forward logic scanner adds to the forward surplus of delay, otherwise the forward logic scanner subtracts from the forward surplus of delay.

The forward surplus of delay can be positive or negative. If the forward surplus of delay is positive, then this gate has the potential of borrowing delay from its upstream cone logic. If the forward surplus of delay is negative, then this gate and its downstream cone of logic must generate enough backward surplus of delay to compensate for this deficit.

After calculating the forward surplus of delay at the output of the gate under consideration, an attempt is made to further slow down the gate, i.e. the designer attempts to increase the gate's current delay target using a gate target delay incrementor 97. The amount of increase in delay is a function of the load, complexity, and stack height of the logic gate. Complex gates will benefit from a relatively larger increase in their delay than will simple gates. The forward surplus of delay at the output of a Gate (under consideration) is recalculated with the new target delay. The increased delay is accepted if (Forward surplus of delay at output of Gate+Backward surplus of delay at output of Gate)>=0. Otherwise, the incrementor 97 of the present invention rejects the delay increase. The surplus condition check ensures that the gate under consideration has a total positive surplus at the output, i.e. the gate under consideration can borrow from positive slack either backwards or forwards or both.

Finally, the propagation delay target tool 14 uses a gate target delay comparator 98 to check if the delay target of any gate was increased via the incrementor 97. If so, then the tool 14 repeats the backward logic scan 94, the forward logic scan 96, and the gate target delay increment 97 to attempt to further increase the delay targets of the logic gates in the specified blocks of logic. The tool 14 terminates this iterative process when the delay targets of the logic gates in the specified blocks of logic cannot be increased any further.

The maximum amount of time borrowing is determined by the amount of clock overlap, clock jitter, and other uncertainties in the clock structure that is used by the logic gates. Given a threshold for the borrowing amount, in the backward logic scanner 94 and the forward logic scanner 96, the forward surplus of delay and backward surplus of delay at the output of any gate is clipped when this threshold (of borrowing) is reached. The clipping of the amount of time borrowed ensures that the evaluate interval of any logic gate falls within a prespecified subinterval of the clock.

Figure 9:
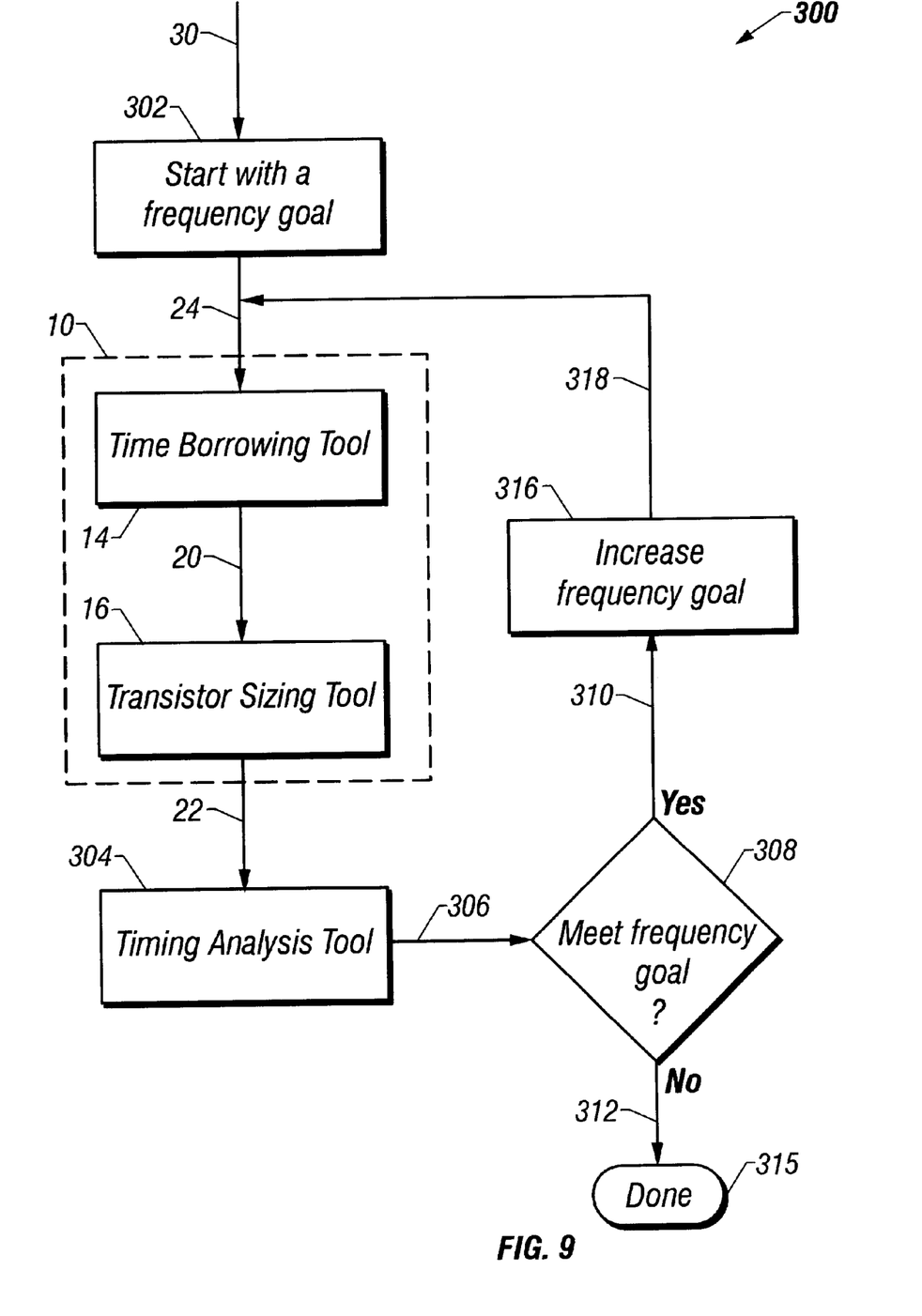
FIG. 9 illustrates the present invention used as part of an automated design process.

FIG. 9 illustrates the propagation delay target tool 14 of the present invention as used as part of an automated design process to determine the highest frequency achievable for the given block of dynamic logic. Initially, the designer starts with a certain frequency goal 302 and a schematic of a block of unsized logic 30. A logic block sizing tool 10 uses a propagation delay target tool 14 to first calculate a propagation delay target. The logic block sizing tool 10 then uses a transistor sizing tool 16 to size the transistors of the logic to achieve the calculated propagation delay targets. A static timing analysis tool 304 time analyzes the specified block of dynamic logic and calculates the worst case timing paths in the logic design. The static timing analysis process is performed after all the transistors in the design have been sized. The analysis can performed with estimated parasitics or with parasitics extracted from layout. By performing static timing analysis, it can be determined if the given logic block met its timing requirements, i.e. the clock speed requirement for the logic block. The next step in the design process is to determine 308 whether the results 306 of the timing analysis tool 304 shows the frequency goal for the specified block of dynamic logic is met. If the frequency goal is met 310, then the designer attempts to increase the frequency goal 316, and repeats 318 this process until the designer is unable 312 to increase the frequency goal and still meet the timing requirements as analyzed in tool 304.

To summarize, the present invention is a dynamic logic propagation delay targeting tool that includes a gate target delay initializer, a levelizer, a backward logic scanner, a forward logic scanner, a gate target delay incrementor, and a gate target delay comparator that together calculates the propagation delay of a signal in a specified block of dynamic logic. The gate target delay initializer calculates the initial delay targets for all logic gates in the specified block of dynamic logic. The levelizer levelizes all the logic gates in the specified block of logic. The backward logic scanner backward scans and calculates an output backward surplus of delay and an input backward surplus of delay. The forward logic scanner forward scans and calculates an input forward surplus of delay and an output forward surplus of delay. The gate target delay incrementor increments delay targets if a positive surplus of delay exists. And, the gate target delay comparator compares the current delay targets to the prior delay targets to further increase the delay targets of all the scanned logic gates of the specified block of logic.

Other embodiments of the invention will be apparent to those skilled in the art after considering this specification or practicing the disclosed invention. The specification and examples above are exemplary only, with the true scope of the invention being indicated by the following claims.

We claim the following invention:

1. A dynamic logic propagation delay targeting tool that calculates the propagation delay of a signal in a specified block of dynamic logic, comprising:

a gate target delay initializer that calculates the initial delay targets for all logic gates in the specified block of dynamic logic;

a levelizer that levelizes all the logic gates in the specified block of logic;

a backward logic scanner that backward scans the logic gates of the specified block of logic and then calculates for each individual scanned logic gate an output backward surplus of delay at the individual scanned logic gate's output and an input backward surplus of delay at the individual logic gate's input;

a forward logic scanner that forward scans the logic gates of the specified block of logic and then calculates for each individual scanned logic gate an input forward surplus of delay at the individual scanned logic gate's input and an output forward surplus of delay at the individual scanned logic gate's output;

a gate target delay incrementor that increments delay targets if a positive surplus of delay exists for each individual scanned logic gate of the specified block of logic; and a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

2. A system that includes a dynamic logic propagation delay targeting tool that calculates the propagation delay of a signal in a specified block of dynamic logic, comprising:

a gate target delay initializer that calculates the initial delay targets for all logic gates in the specified block of dynamic logic;

a levelizer that levelizes all the logic gates in the specified block of logic;

a backward logic scanner that backward scans the logic gates of the specified block of logic and then calculates for each individual scanned logic gate an output backward surplus of delay at the individual scanned logic gate's output and an input backward surplus of delay at the individual logic gate's input;

a forward logic scanner that forward scans the logic gates of the specified block of logic and then calculates for each individual scanned logic gate an input forward surplus of delay at the individual scanned logic gate's input and an output forward surplus of delay at the individual scanned logic gate's output;

a gate target delay incrementor that increments delay targets if a positive surplus of delay exists for each individual scanned logic gate of the specified block of logic; and a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

3. A method to make a dynamic logic propagation delay targeting tool that calculates the propagation delay of a signal in a specified block of dynamic logic, comprising:

providing a gate target delay initializer that calculates the initial delay targets for all logic gates in the specified block of dynamic logic;

providing a levelizer that levelizes all the logic gates in the specified block of logic;

providing a backward logic scanner that backward scans the logic gates of the specified block of logic and then calculates for each individual scanned logic gate an output backward surplus of delay at the individual scanned logic gate's output and an input backward surplus of delay at the individual logic gate's input;

providing a forward logic scanner that forward scans the logic gates of the specified block of logic and then calculates for each individual scanned logic gate an input forward surplus of delay at the individual scanned logic gate's input and an output forward surplus of delay at the individual scanned logic gate's output;

providing a gate target delay incrementor that increments delay targets if a positive surplus of delay exists for each individual scanned logic gate of the specified block of logic; and providing a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

4. A method to use a dynamic logic propagation delay targeting tool that calculates the propagation delay of a signal in a specified block of dynamic logic, comprising:

initializing with a gate target delay initializer that calculates the initial delay targets for all logic gates in the specified block of dynamic logic;

levelizing with a levelizer that levelizes all the logic gates in the specified block of logic;

backward scanning with a backward logic scanner that backward scans the logic gates of the specified block of logic and then calculates for each individual scanned logic gate an output backward surplus of delay at the individual scanned logic gate's output and an input backward surplus of delay at the individual logic gate's input;

forward scanning a forward logic scanner that forward scans the logic gates of the specified block of logic and then calculates for each individual scanned logic gate an input forward surplus of delay at the individual scanned logic gate's input and an output forward surplus of delay at the individual scanned logic gate's output;

incrementing with a gate target delay incrementor that increments delay targets if a positive surplus of delay exists for each individual scanned logic gate of the specified block of logic; and comparing with a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

5. A program storage device readable by a computer that tangibly embodies a program of instructions executable by the computer to perform a method to use a dynamic logic propagation delay targeting tool that calculates the propagation delay of a signal in a specified block of dynamic logic, comprising:

initializing with a gate target delay initializer that calculates the initial delay targets for all logic gates in the specified block of dynamic logic;

levelizing with a levelizer that levelizes all the logic gates in the specified block of logic;

backward scanning with a backward logic scanner that backward scans the logic gates of the specified block of logic and then calculates for each individual scanned logic gate an output backward surplus of delay at the individual scanned logic gate's output and an input backward surplus of delay at the individual logic gate's input;

forward scanning a forward logic scanner that forward scans the logic gates of the specified block of logic and then calculates for each individual scanned logic gate an input forward surplus of delay at the individual scanned logic gate's input and an output forward surplus of delay at the individual scanned logic gate's output;

incrementing with a gate target delay incrementor that increments delay targets if a positive surplus of delay exists for each individual scanned logic gate of the specified block of logic; and comparing with a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

6. A dependent claim according to claims 1, 2, 3, 4, or 5 wherein the levelizing of all the logic gates in the specified block of logic further comprises ordering the logic gates in the logic block to analyze the propagation of the signal through the logic block.

7. A dependent claim according to claims 1, 2, 3, 4, or 5 wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay–(Current Delay Target of Gate+Wire Delay at output of Gate)+Backward surplus at output of Gate.

8. A dependent claim according to claims 1, 2, 3, 4, or 5 wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay–(Current Delay Target of Gate+Wire Delay at output of Gate)+Forward surplus at input of Gate.

9. A dependent claim according to claims 1, 2, 3, 4, or 5 wherein said positive surplus of delay is defined as the (Forward surplus at output of Gate+Backward surplus at output of Gate)>=0.

10. A dynamic logic propagation delay targeting tool that calculates the propagation delay of a signal in a specified block of dynamic logic, comprising:

a gate target delay initializer that calculates the initial delay targets for all logic gates in the specified block of dynamic logic;

a levelizer that levelizes all the logic gates in the specified block of logic wherein the levelizing of all the logic gates further comprises ordering the logic gates in the logic block to analyze the propagation of the signal through the logic block;

a backward logic scanner that backward scans the logic gates of the specified block of logic and then calculates for each individual scanned logic gate an output backward surplus of delay at the individual scanned logic gate's output and an input backward surplus of delay at the individual logic gate's input, wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay–(Current Delay Target of Gate+Wire Delay at output of Gate)+Backward surplus at output of Gate;

a forward logic scanner that forward scans the logic gates of the specified block of logic and then calculates for each individual scanned logic gate an input forward surplus of delay at the individual scanned logic gate's input and an output forward surplus of delay at the individual scanned logic gate's output, wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay–(Current Delay Target of Gate+Wire Delay at output of Gate)+Forward surplus at input of Gate;

a gate target delay incrementor that increments delay targets if a positive surplus of delay exists for each individual scanned logic gate of the specified block of logic, wherein the said positive surplus of delay is defined as the (Forward surplus at output of Gate+Backward surplus at output of Gate)>=0; and a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

11. A system that includes a dynamic logic propagation delay targeting tool that calculates the propagation delay of a signal in a specified block of dynamic logic, comprising:

a gate target delay initializer that calculates the initial delay targets for all logic gates in the specified block of dynamic logic;

a levelizer that levelizes all the logic gates in the specified block of logic wherein the levelizing of all the logic gates further comprises ordering the logic gates in the logic block to analyze the propagation of the signal through the logic block;

a backward logic scanner that backward scans the logic gates of the specified block of logic and then calculates for each individual scanned logic gate an output backward surplus of delay at the individual scanned logic gate's output and an input backward surplus of delay at the individual logic gate's input, wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay–(Current Delay Target of Gate+Wire Delay at output of Gate)+Backward surplus at output of Gate;

a forward logic scanner that forward scans the logic gates of the specified block of logic and then calculates for each individual scanned logic gate an input forward surplus of delay at the individual scanned logic gate's input and an output forward surplus of delay at the individual scanned logic gate's output, wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay−(Current Delay Target of Gate+Wire Delay at output of Gate)+ Forward surplus at input of Gate;

a gate target delay incrementor that increments delay targets if a positive surplus of delay exists for each individual scanned logic gate of the specified block of logic, wherein the said positive surplus of delay is defined as the (Forward surplus at output of Gate+ Backward surplus at output of Gate) >=0; and a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

12. A method to make a dynamic logic propagation delay targeting tool that calculates the propagation delay of a signal in a specified block of dynamic logic, comprising:

providing a gate target delay initializer that calculates the initial delay targets for all logic gates in the specified block of dynamic logic;

providing a levelizer that levelizes all the logic gates in the specified block of logic wherein the levelizing of all the logic gates further comprises ordering the logic gates in the logic block to analyze the propagation of the signal through the logic block;

providing a backward logic scanner that backward scans the logic gates of the specified block of logic and then calculates for each individual scanned logic gate an output backward surplus of delay at the individual scanned logic gate's output and an input backward surplus of delay at the individual logic gate's input, wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay− (Current Delay Target of Gate+Wire Delay at output of Gate)+Backward surplus at output of Gate;

providing a forward logic scanner that forward scans the logic gates of the specified block of logic and then calculates for each individual scanned logic gate an input forward surplus of delay at the individual scanned logic gate's input and an output forward surplus of delay at the individual scanned logic gate's output, wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay−(Current Delay Target of Gate+Wire Delay at output of Gate)+Forward surplus at input of Gate;

providing a gate target delay incrementor that increments delay targets if a positive surplus of delay exists for each individual scanned logic gate of the specified block of logic, wherein the said positive surplus of delay is defined as the (Forward surplus at output of Gate+Backward surplus at output of Gate)>=0; and providing a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

13. A method to use a dynamic logic propagation delay targeting tool that calculates the propagation delay of a signal in a specified block of dynamic logic, comprising:

initializing with a gate target delay initializer that calculates the initial delay targets for all logic gates in the specified block of dynamic logic;

levelizing with a levelizer that levelizes all the logic gates in the specified block of logic wherein the levelizing of all the logic gates further comprises ordering the logic gates in the logic block to analyze the propagation of the signal through the logic block;

backward scanning with a backward logic scanner that backward scans the logic gates of the specified block of logic and then calculates for each individual scanned logic gate an output backward surplus of delay at the individual scanned logic gate's output and an input backward surplus of delay at the individual logic gate's input, wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay−(Current Delay Target of Gate+Wire Delay at output of Gate)+Backward surplus at output of Gate;

forward scanning with a forward logic scanner that forward scans the logic gates of the specified block of logic and then calculates for each individual scanned logic gate an input forward surplus of delay at the individual scanned logic gate's input and an output forward surplus of delay at the individual scanned logic gate's output, wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay−(Current Delay Target of Gate+ Wire Delay at output of Gate)+Forward surplus at input of Gate;

incrementing with a gate target delay incrementor that increments delay targets if a positive surplus of delay exists for each individual scanned logic gate of the specified block of logic, wherein the said positive surplus of delay is defined as the (Forward surplus at output of Gate+Backward surplus at output of Gate)>= 0; and comparing with a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

14. A program storage device readable by a computer that tangibly embodies a program of instructions executable by the computer to perform a method to use a dynamic logic propagation delay targeting tool that calculates the propagation delay of a signal in a specified block of dynamic logic, comprising:

initializing with a gate target delay initializer that calculates the initial delay targets for all logic gates in the specified block of dynamic logic;

levelizing with a levelizer that levelizes all the logic gates in the specified block of logic wherein the levelizing of all the logic gates further comprises ordering the logic gates in the logic block to analyze the propagation of the signal through the logic block;

backward scanning with a backward logic scanner that backward scans the logic gates of the specified block of logic and then calculates for each individual scanned logic gate an output backward surplus of delay at the individual scanned logic gate's output and an input backward surplus of delay at the individual logic gate's input, wherein said output backward surplus of delay at the individual scanned logic gate's output is defined to be the minimum of all the backward surpluses at the inputs of all the logic gates that are connected to the output of the individual scanned logic gate, and wherein said input backward surplus of delay at the individual logic gate's input is equal to the nominal phase delay−(Current Delay Target of Gate+Wire Delay at output of Gate)+Backward surplus at output of Gate;

forward scanning with a forward logic scanner that forward scans the logic gates of the specified block of logic and then calculates for each individual scanned logic gate an input forward surplus of delay at the individual scanned logic gate's input and an output forward surplus of delay at the individual scanned logic gate's output, wherein said input forward surplus of delay at the individual scanned logic gate's input is defined to be the minimum of all the forward surpluses at the outputs of all the logic gates that are connected to the input of the individual scanned logic gate, and wherein said output forward surplus of delay at the individual scanned logic gate's output is equal to the nominal phase delay−(Current Delay Target of Gate+Wire Delay at output of Gate)+Forward surplus at input of Gate;

incrementing with a gate target delay incrementor that increments delay targets if a positive surplus of delay exists for each individual scanned logic gate of the specified block of logic, wherein the said positive surplus of delay is defined as the (Forward surplus at output of Gate+Backward surplus at output of Gate)>=0; and comparing with a gate target delay comparator that compares the current delay targets of each individual scanned logic gate of the specified block of logic to the prior delay targets of each individual scanned logic gate of the specified block of logic to further increase the delay targets of all the scanned logic gates of the specified block of logic.

* * * * *